(12) United States Patent
Wymore et al.

(10) Patent No.: US 11,552,237 B2
(45) Date of Patent: Jan. 10, 2023

(54) GRAIN SIZE CONTROL OF SUPERCONDUCTING MATERIALS IN THIN FILMS FOR JOSEPHSON JUNCTIONS

(71) Applicant: INTERNATIONAL BUSINESS MACHINES CORPORATION, Armonk, NY (US)

(72) Inventors: Benjamin Wymore, Cortlandt Manor, NY (US); Christian Lavoie, Pleasantville, NY (US); Markus Brink, White Plains, NY (US); John Bruley, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/997,508

(22) Filed: Aug. 19, 2020

(65) Prior Publication Data

US 2022/0059748 A1 Feb. 24, 2022

(51) Int. Cl.
*H01L 39/02* (2006.01)
*H01L 39/12* (2006.01)
*H01L 39/24* (2006.01)

(52) U.S. Cl.
CPC ............ *H01L 39/025* (2013.01); *H01L 39/12* (2013.01); *H01L 39/2493* (2013.01)

(58) Field of Classification Search
CPC .... H01L 39/025; H01L 39/12; H01L 39/2493
See application file for complete search history.

(56) References Cited

U.S. PATENT DOCUMENTS

| | | | |
|---|---|---|---|
| 3,816,845 A | 6/1974 | Cuomo et al. | |
| 4,295,147 A | 10/1981 | Kircher et al. | |
| 4,496,648 A | 1/1985 | Young | |
| 4,980,341 A | 12/1990 | Gehring | |
| 9,666,783 B2 | 5/2017 | Faley | |
| 2003/0102470 A1 | 6/2003 | Il'ichev et al. | |
| 2007/0108437 A1* | 5/2007 | Tavkhelidze | H01L 39/223 257/36 |

OTHER PUBLICATIONS

Masu et al. Single Crystallization of Aluminum on SiO2 by Thermal Annealing and Observation with scanning micro-Rheed Microscope, Jpn Jrn of Appl. Phys vol. 30 No. 1a. Jan. 1991 p. 56-59. (Year: 1991).*

Fritz et al. "Optimization of Al/AlOx/Al-Layer Systems for Josephson Junctions from a Microstructure Point of View," arXiv:1901.09625 Mar. 2019 (Year: 2019).*

(Continued)

*Primary Examiner* — Matthew L Reames
(74) *Attorney, Agent, or Firm* — Amin, Turocy & Watson, LLP

(57) ABSTRACT

A superconducting circuit includes a Josephson junction device including a lower superconducting material layer formed on a substrate and a junction layer formed on the lower superconducting material layer. The superconducting circuit also includes an upper superconducting material layer formed over the junction layer. At least the lower superconducting material layer comprises grains having a size that is larger than a size of the Josephson junction.

25 Claims, 9 Drawing Sheets

(56) References Cited

OTHER PUBLICATIONS

Fritz S. et al.,: "Optimization of Al/AlOx/Al-layer systems for Josephson junctions from a microstructure point of view", Journal of Applied Physics, vol. 125, 165301, Apr. 22, 2019, XP012237223.
Nik S. et al., "Correlation between Al grain size, grain boundary grooves and local variations in oxide barrier thickness of Al/AlOx/Al tunnel junctions by transmission electron microscopy", Spingerplus, vol. 5, 1067, Jul. 13, 2016 XP055857637.
PCT/EP2021/071868 Internationa Search Report dated Jan. 11, 2022.
PCT/EP2021/071868 Written Opinion dated Jan. 11, 2022.

* cited by examiner

GRAIN SIZE CONTROL OF SUPERCONDUCTING MATERIALS IN THIN FILMS FOR JOSEPHSON JUNCTIONS

BACKGROUND

The currently claimed embodiments of the present invention relate to a method for controlling grain size of superconducting materials for Josephson junctions and a Josephson junction circuit having the same.

Quantum circuits, including Josephson junctions, have a number of applications. Quantum computing circuits employ qubits which may include Josephson junctions. The Josephson junction is often formed as a stack of a lower superconducting material layer (such as an aluminum superconducting layer), a thin oxide, and an upper superconducting material layer (e.g., aluminum layer), where the stack is formed on a substrate, such as silicon. The grain size in thin films of superconducting material layers such as aluminum layers is a significant fraction of the size of a Josephson junction. As a result, junctions may contain variable quantities of aluminum grains. As a result, when moving from junction to junction, the ratio of grain boundary (GB) area to superconducting aluminum (Al) grain area can vary, and this leads to material based non-uniformity in the Josephson junction properties.

Furthermore, oxidation of aluminum surfaces during fabrication of Josephson junctions occurs at different rates on different surfaces or at grain boundaries, with different penetration on different GB orientations. If the superconducting (aluminum) grain size in the superconducting material layers is similar in size as compared to a size of the Josephson junction, the number of grains and grain boundary area, where oxidation can be different, may vary from one junction to the next causing a material-based variation in the Josephson junction properties.

Therefore, it would be desirable to solve the above and other problems of the prior art by, for example, controlling a grain size of the superconducting material layer(s).

SUMMARY

An aspect of the present invention is to provide a superconducting circuit. The superconducting circuit includes a Josephson junction device including a lower superconducting material layer formed on a substrate; a junction layer formed on the lower superconducting material layer; and an upper superconducting material layer formed over the junction layer. At least the lower superconducting material layer includes grains having a size that is larger than a size of the Josephson junction.

In an embodiment, the lower superconducting material layer is formed of a single crystalline grain. In an embodiment, the lower superconducting material layer is epitaxial with the substrate. In an embodiment, the epitaxial lower superconducting material is formed of aluminum. In an embodiment, the aluminum is oriented such that the (110) planes are parallel to the substrate. In an embodiment, the grains in the lower superconducting material layer are formed by increasing the size of the grains through annealing. In an embodiment, the substrate has at least one of silicon (Si) and sapphire.

Another aspect of the present invention is to provide a superconducting circuit including a Josephson junction device including a superconducting alloy layer; and a junction layer formed on the superconducting alloy layer. The superconducting alloy layer has an average grain size smaller than a width and length of a Josephson junction of the Josephson junction device and less than approximately 20 nm.

In an embodiment, the superconducting alloy layer is an aluminum alloy layer. In an embodiment, the average grain size of the aluminum alloy layer is less than 10 nm. In an embodiment, the superconducting alloy layer is amorphous. In an embodiment, the aluminum alloy comprises aluminum and at least one element selected from the group consisting of Si, Mg, V, Nb, Ta, La, Zr, Hf, Ti, Zn, In, and Sn. In an embodiment, the concentration of aluminum in the aluminum alloy is in a range between about 66% and about 97%.

A further aspect of the present invention is to provide a method of forming a Josephson junction device. The method includes forming a superconducting material layer on a substrate; and annealing the superconducting material layer such that the superconducting material layer has a single grain over a width and a length of a Josephson junction of the Josephson junction device.

In an embodiment, the superconducting material layer is an aluminum layer. In an embodiment, the single grain is epitaxially aligned with the substrate. In an embodiment, the substrate has at least one of Si and sapphire. In an embodiment, the annealing is performed within a temperature ranging from about 200° C. to about 570° C. and preferentially from about 400° C. to about 570° C.

Another aspect of the present invention is to provide a method of forming a Josephson junction of a Josephson Junction device. The method includes forming a superconducting alloy layer of the Josephson junction device on a substrate. The superconducting alloy layer has an average grain size smaller than a width and a length of the Josephson junction and less than approximately 20 nm.

In an embodiment, the superconducting alloy layer is an aluminum alloy layer. In an embodiment, the average grain size is less than 10 nm. In an embodiment, the superconducting alloy layer is amorphous. In an embodiment, the aluminum alloy layer is amorphous. In an embodiment, the aluminum alloy layer comprises aluminum and at least one element selected from the group consisting of Si, Mg, V, Nb, Ta, La, Zr, Hf, Ti, Zn, In, and Sn. In an embodiment, a concentration of aluminum in the aluminum alloy layer is in a range between about 66% and about 97%.

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

In order to address the issues due to a superconducting grain having a similar size as a size of the Josephson junction, a microstructure of Josephson junction is controlled to make the superconducting grain size either much larger than the size of Josephson junction or much smaller than the size of the Josephson junction, according to some embodiments.

In an embodiment, increasing the grain size of the superconducting material (e.g., aluminum) can be accomplished using high temperature annealing followed by cooling of the superconducting material. By increasing grain size dramatically, it is possible to provide a Josephson junction in single grain superconducting material which is equivalent to building in single crystal superconducting material.

As an alternative to increasing the superconducting material grain size to be larger than the Josephson junction size, the superconducting material grain size may be controlled to be much smaller than the Josephson junction size. For example, the superconducting material grain size may be decreased through alloying of the superconducting material. For decreasing the superconducting material grain size, a Josephson junction built using smaller grain of superconducting material might contain hundreds of grains and be similar from Josephson junction to Josephson junction, thus reducing variation of the Josephson junction structure due to the superconducting material grain size. Ultimately, an amorphous superconducting material alloy layer, similar to the single superconducting material grain junction, can also have material that is uniform from Josephson junction to Josephson junction. According to some embodiments, the alloyed superconducting material may be formed via evaporation or sputtering.

Figure 1:
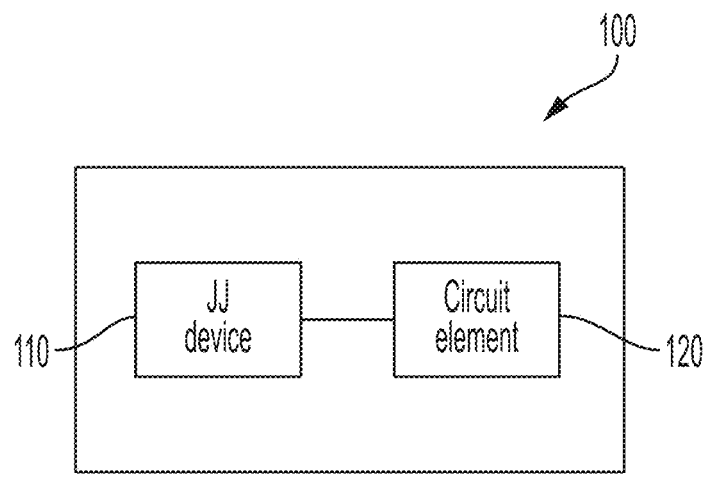
FIG. 1 is a Josephson junction circuit 100, according to some embodiments of the present invention.

FIG. 1 is a Josephson junction circuit 100, according to some embodiments. The Josephson junction circuit 100 includes a Josephson junction device 110, and circuit elements 120, which are coupled to the Josephson junction (JJ) device 110.

Figure 2A:
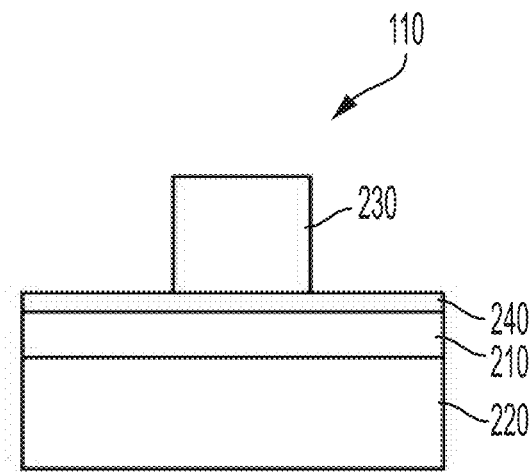
FIG. 2A is a side cross-sectional view of a Josephson junction, according to some embodiments of the present invention.

FIG. 2A is a side cross-sectional view of a Josephson junction (JJ) device, according to some embodiments of the present invention. The Josephson junction device includes a bottom superconducting material layer 210 formed on a substrate 220. A top superconducting material layer 230 is formed over the bottom superconducting material layer 210 with a thin oxide layer 240 functioning as a tunneling layer disposed between the bottom superconducting material layer 210 and the top superconducting material layer 230.

In an embodiment, the bottom or lower superconducting material layer 210 is formed of a single crystalline grain. In an embodiment, the lower superconducting material layer 210 is epitaxial with the substrate 220. In an embodiment, the lower superconducting material layer 210 and/or the upper superconducting material layer 230 is/are formed of aluminum. In an embodiment, the substrate 220 includes silicon (Si) and/or sapphire. In an embodiment, the thin oxide layer (tunneling junction layer) 240 comprises a thin oxide of the lower superconducting material layer 210.

Figure 2B:
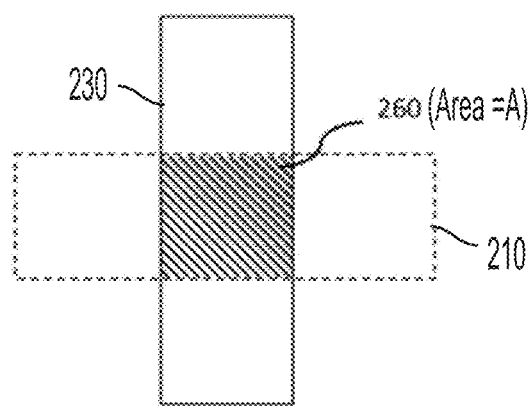
FIG. 2B is a top cutaway view of the Josephson junction device of FIG. 2A, according to some embodiments of the present invention.

FIG. 2B is a top cutaway view of the Josephson junction device of FIG. 2A, illustrating a Josephson junction (JJ) 260, where the thin oxide layer 240 contacts and separates the bottom superconducting material layer 210 from the top superconducting material layer 230. The size of the Josephson junction 260 is outlined by the pattern in FIG. 2B, which shows the region where the bottom superconducting material layer 210 and the top aluminum layer 230 contact the thin oxide layer 240, which functions as a tunneling barrier.

While the Josephson junction device of FIG. 2A and FIG. 2B illustrates a single Josephson junction, the number of Josephson junctions of the Josephson junction device may be a plurality (i.e., two or more).

Figure 3A:
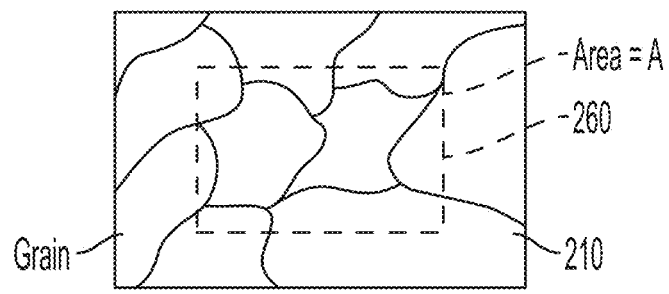
FIG. 3A illustrates a portion of the bottom aluminum layer before annealing, according to some embodiments of the present invention.

FIG. 3A illustrates a portion of the bottom superconducting material layer 210, before annealing an area A, where the grains of the bottom superconducting material layer 210 are shown within the region of the Josephson junction 260.

Figure 3B:
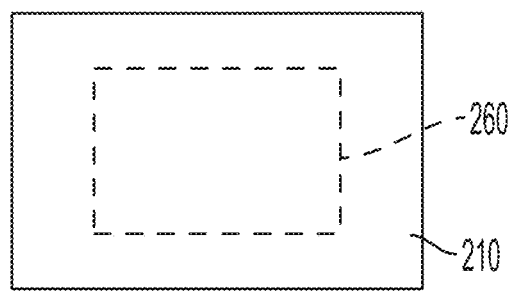
FIG. 3B illustrates a portion of the bottom aluminum layer after annealing, according to some embodiments of the present invention.

Annealing to increase grain size: FIG. 3B illustrates a portion of the bottom superconducting material layer 210, after annealing of the bottom superconducting material layer 210, which overlaps a Josephson junction 260 having a size being an area A, where the grains of the bottom superconducting material layer 210 are shown within the region of the Josephson junction 260. In an embodiment, the grains in the bottom or lower superconducting material 210 layer are formed by increasing the size of the grains through annealing. Comparing FIGS. 3A and 3B, it can be seen that annealing of the bottom superconducting material layer 210 increases the grain size such that a single grain of the bottom superconducting material layer 210 overlaps the region of the Josephson junction 260. Annealing the bottom superconducting material layer 210 is such that the bottom superconducting material layer 210 has a single crystalline grain over the width and length of a Josephson junction of the device. The annealing may be performed, for example, within a temperature range from about 200° C. to about 570° C., and preferentially from about 400° C. to about 570° C.

While FIG. 3B illustrates that annealing of the bottom superconducting material layer 210 increases the grain size such that a single grain of the bottom superconducting material layer 210 overlaps the region of the Josephson junction 260, alternatively the top superconducting material layer 230 may be annealed to increase the grain size such that a single grain of the top superconducting material layer 230 overlaps the region of the Josephson junction 260.

Referring to FIG. 2A, the substrate 220 may be formed of silicon, such as Si (001). Due to the annealing process, at least the bottom superconducting material (e.g., aluminum) layer 210 may be formed of a single crystalline grain and may be epitaxial with the substrate 220, where the single crystalline grain is formed by increasing the superconducting material (e.g., aluminum) grain size through annealing.

Figure 4:
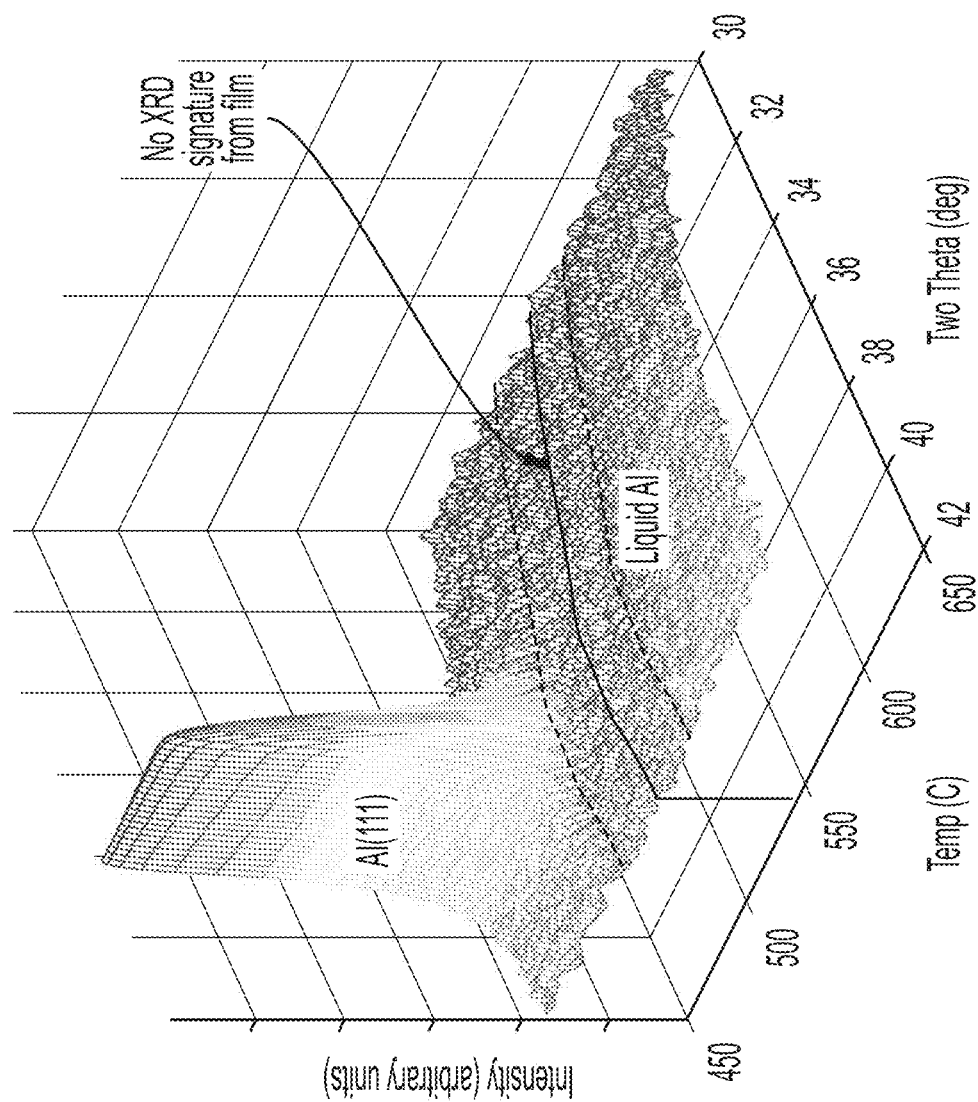
FIG. 4 illustrates an X-ray diffraction (XRD) intensity graph as a function of temperature for aluminum, according to some embodiments of the present invention.

FIG. 4 illustrates an x-ray diffraction (XRD) intensity graph as a function of temperature for superconducting material (e.g., aluminum). In situ XRD was performed using a linear detector during annealing of a 35 nm thick superconducting material (e.g., aluminum) on a Si (001) substrate, with a 4.5° C./s ramp rate and in a purified He atmosphere. The lower temperatures show the deposited Al to have (111) planes oriented parallel to the surface of the silicon substrate. The Al (111) peak and X-ray scattering background disappear about 50° C. below the eutectic melting temperature. Melting of the superconducting material was detected by an increase in background x-rays at approximately the eutectic melting temperature of approximately 577° C.

Figure 5A:
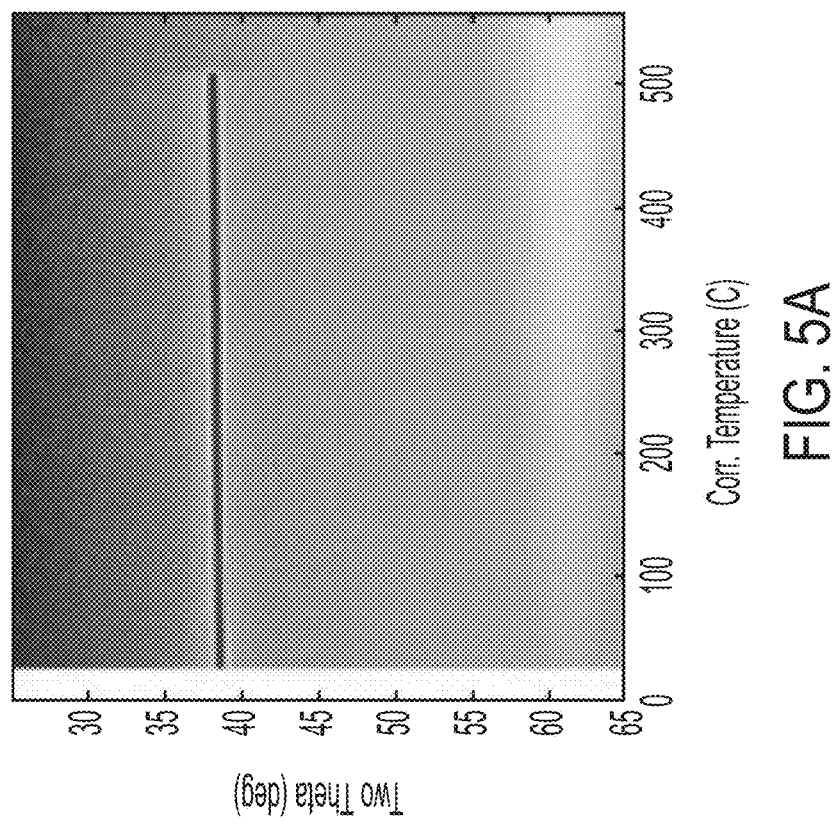
FIGS. 5A and 5B are graphs illustrating the existence of the XRD Al (111) peak as a function of temperature and time respectively, according to some embodiments of the present invention.
Figure 5B:
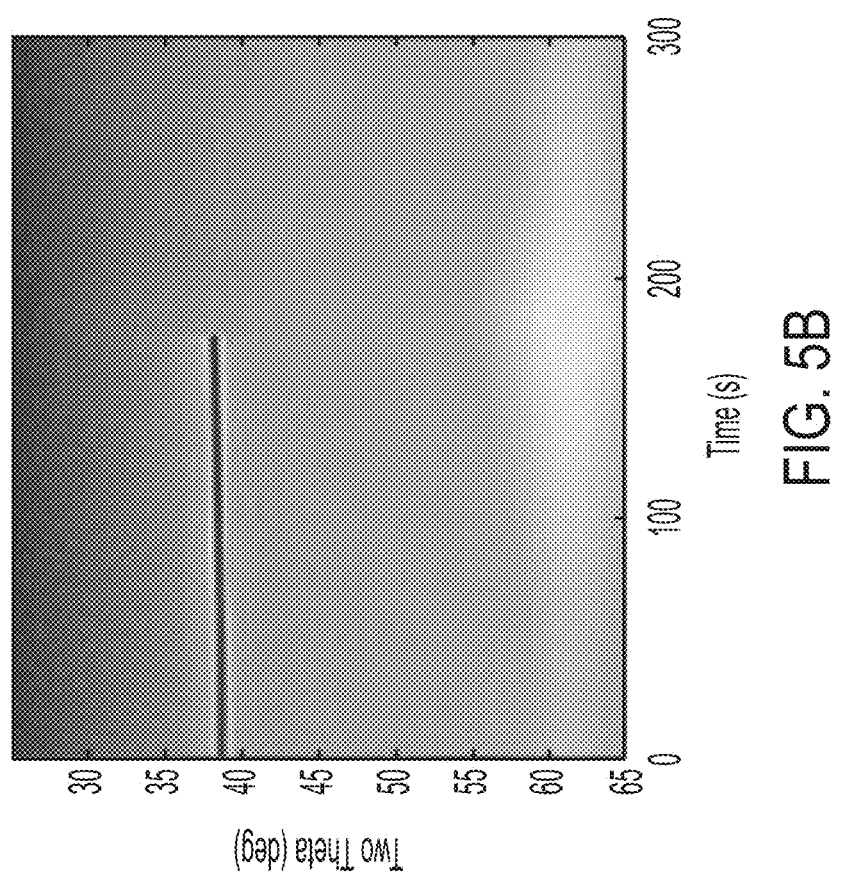

FIGS. 5A and 5B illustrate the existence of the XRD Al (111) peak as a function of temperature and time respectively, where the Al (111) peak disappears at higher temperature and the sample is cooled before it reaches the melting point. Cooling the aluminum after anneal does not result in the Al (111) peak reappearing. A quench in the featureless temperature zone showed no Al peaks in the detector geometry, within the area of K-space probed. Post quench no Al (111) peak was detected for the detector geometry. Thus, the (111) oriented aluminum followed by a quench produced aluminum with no Al (111) peak.

Figure 6A:
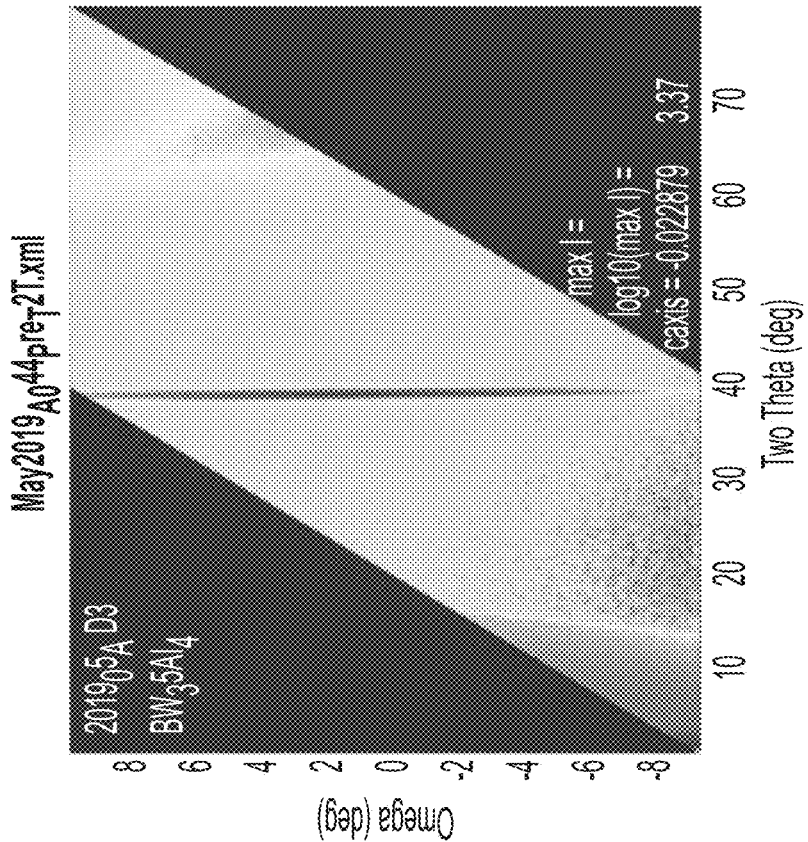
FIGS. 6A and 6B are graphs illustrating XRD measurements before and after annealing deposited aluminum, respectively, according to some embodiments of the present invention.
Figure 6B:
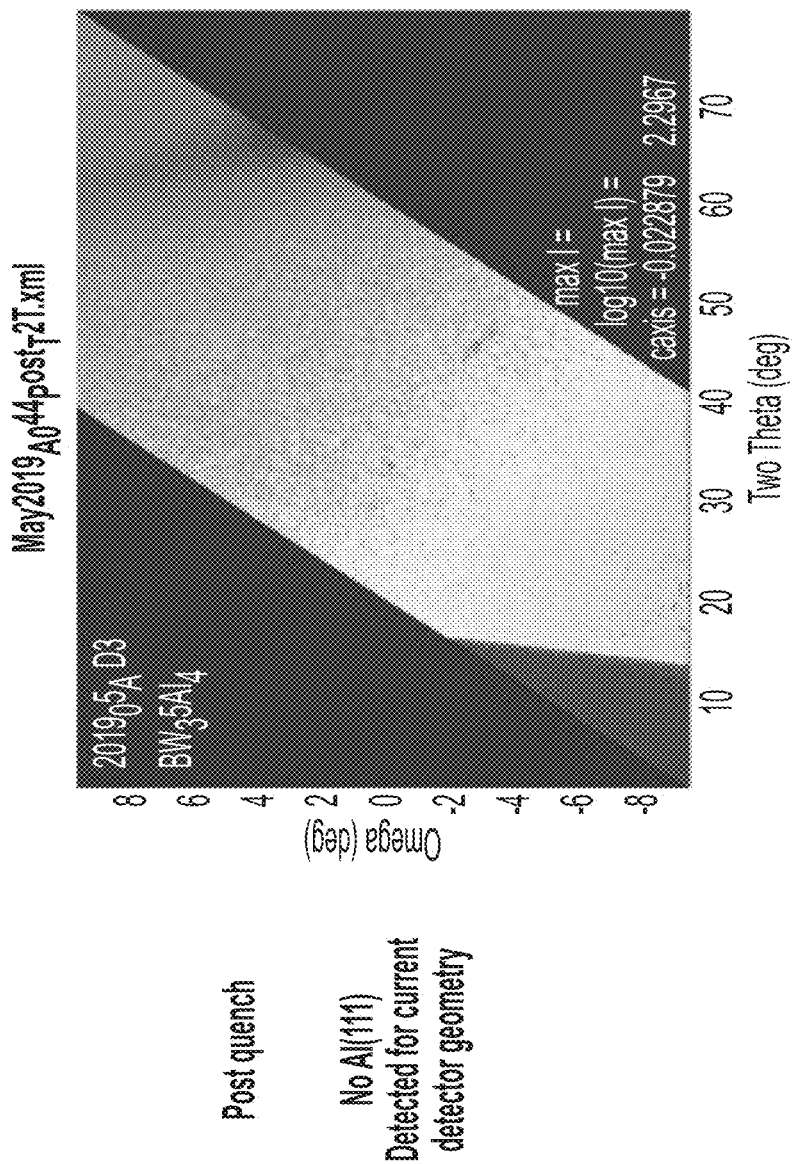

FIG. 6A illustrates θ2θ XRD measurements performed on as deposited aluminum films show only the Al (111) peak with rocking FWHM (full width at half maximum) of approximately 8 degree in Omega (fiber width). FIG. 6B illustrates θ2θ XRD measurements performed on annealed aluminum where no Al (111) peak is detected after the quench.

Figure 7:
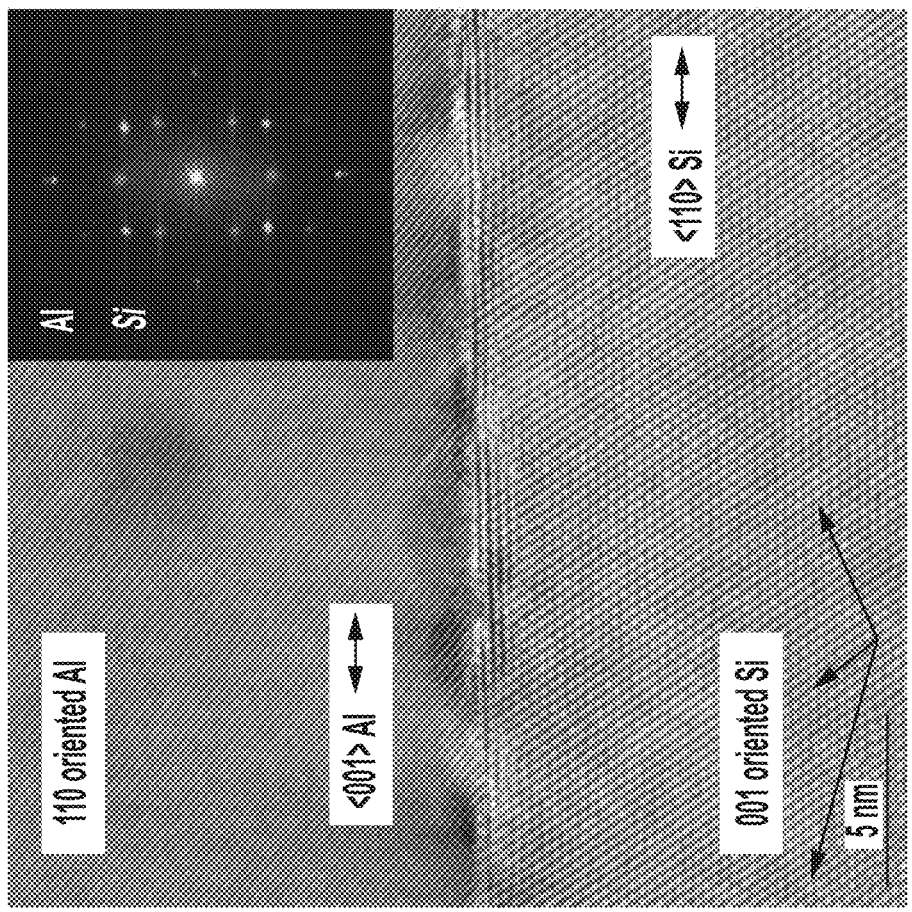
FIG. 7 is a transmission electron microscopy image showing the effect of annealing of Al (111) on Si (100), according to some embodiments of the present invention.

FIG. 7 is a transmission electron microscopy image showing the effect of annealing of Al (111) on Si (100) to a temperature where the (111) peak disappears but before the eutectic melting point followed by rapid cooling increased the aluminum grain size such that a single grain becomes much larger than the size of a Josephson junction. Moreover, the aluminum changed in orientation from (111) to (110). A grain size of greater than 5 microns is achieved for the aluminum, and the aluminum is epitaxially formed on the silicon substrate. The texture of the aluminum film changes from (111) to (110) and is very strongly aligned to the Si (100) substrate. Mismatch between the aluminum and silicon films is accommodated by some oxide islands at the interface and a low density of stacking faults and threading dislocations. The oxidation for a Josephson junction can thus be performed on a single grain of the bottom or lower aluminum layer eliminating the variability that originate from grain boundaries.

Figure 8:
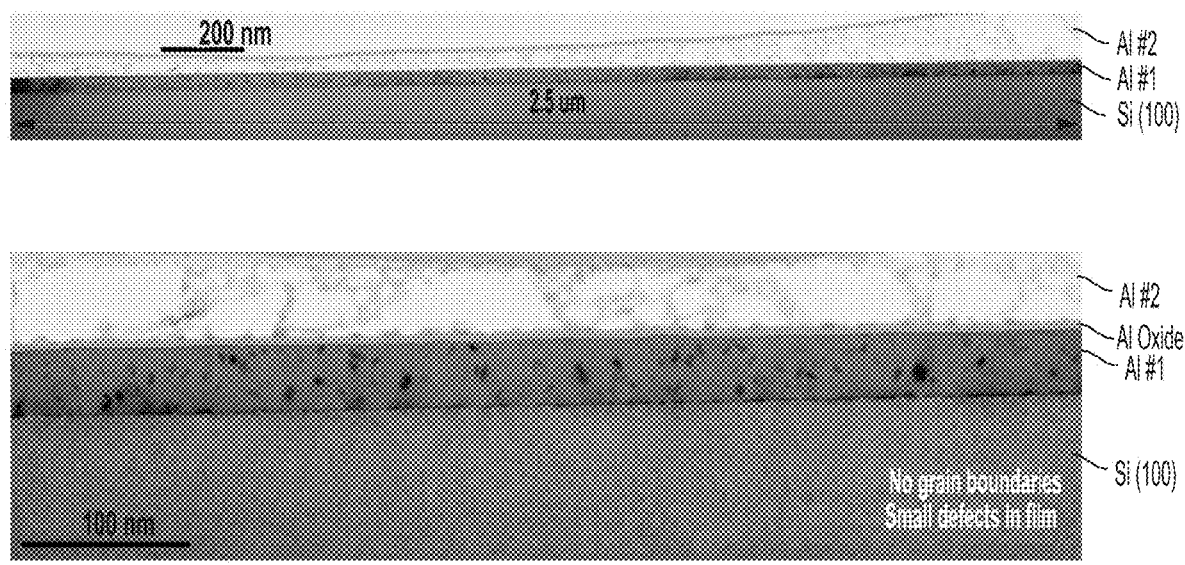
FIG. 8 is a transmission electron microscopy image showing the effect of annealing of Al (111) on Si (100) over a larger region of the device, according to some embodiments of the present invention.

FIG. 8 is a transmission electron microscopy image showing the aluminum layer after quench at a lower resolution where no grain boundaries in the aluminum are present over the image and only small defects are present in the aluminum layer.

Figure 3C:
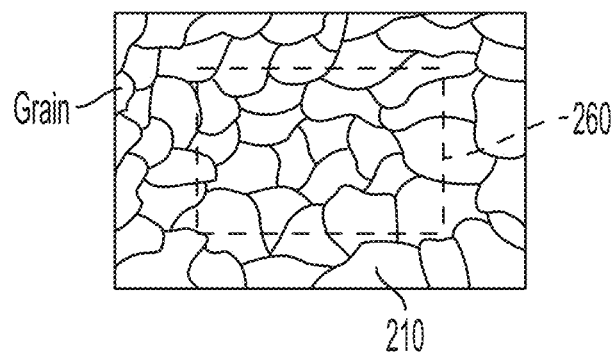
FIG. 3C illustrates a portion of the bottom aluminum layer, after alloying of the bottom aluminum layer, which overlaps a Josephson junction, according to some embodiments of the present invention.

Alloying to decrease grain size: FIG. 3C illustrates a portion of the bottom superconducting material layer 210, after alloying of the bottom superconducting material layer 210, which overlaps a Josephson junction 260 having a size being an area A, where the grains of the bottom superconducting material layer 210 are shown within the region of the Josephson junction 260. Comparing FIGS. 3A and 3C, it can be seen that alloying of the bottom superconducting material layer 210 decreases the grain size such that multiple grains of the bottom superconducting material layer 210 overlap the region of the Josephson junction 260. Alloying the bottom superconducting material layer 210 is such that the bottom superconducting material layer 210 has an average grain size smaller than a width and length of a Josephson junction of the device. In an embodiment, the average grain size of the bottom superconducting material layer 210 may be less than 20 nm, for example. In another embodiment, the average grain size of the bottom superconducting material layer 210 may be less than 10 nm, for example. In an embodiment, the number of grains of the bottom superconducting material layer 210 which contact and overlap the Josephson junction may be greater than or equal to 10, for example. In another embodiment, the number of grains of the bottom superconducting material layer 210 which contact and overlap the Josephson junction may be greater than or equal to 50, for example. In a further embodiment, the number of grains of the bottom superconducting material layer 210 which contact and overlap the Josephson junction may be greater than or equal to 100, for example. The bottom superconducting material layer 210 may have a reduced grain size or be amorphous, for example. While the bottom superconducting material layer 210 may have a reduced grain size or be amorphous, alternately, or additionally, the top superconducting material layer 230 may have a reduced grain size or be amorphous through alloying the superconducting material.

Small grain size of the superconducting material relative to the junction is beneficial. When the Josephson junction contains many hundreds of grains of superconducting material overlapping the junction, the materials variation from junction to junction is substantially reduced. At the limit of reducing superconducting material grain size, the superconducting material is amorphous and variability is eliminated between junctions. As there are no crystalline planes of the amorphous superconducting material, the superconducting material surface is the same irrespective of surface angle of the superconducting material, i.e., the sidewalls and edges of the superconducting material film have the same surface.

The superconducting material alloy (e.g., aluminum alloy) may include aluminum and at least one alloying element. The alloying element may include Si, Mg, V, Nb, Ta, La, Zr, Hf, Ti, Zn, In, and/or Sn. The concentration of aluminum in the aluminum alloy is in the range between about 66% and about 97%. The alloyed aluminum may be formed via evaporation or sputtering, according to some embodiments.

In an embodiment, for forming an amorphous aluminum layer which is light, Mg may be used as an alloying element. According to some embodiments, the aluminum alloy may be formed with low concentration of Si, Mg, V, Nb, Ta, La, Zr, Hf, Ti, Zn, In, and/or Sn. According to some embodiments an alloying element for grabbing oxygen in solution may be added, such as a low concentrations of Zr, Hf and/or Ti.

The descriptions of the various embodiments have been presented for the purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A superconducting circuit comprising:
   a Josephson junction device comprising:
      a lower superconducting material layer formed on a substrate;
      a barrier layer formed on the lower superconducting material layer; and
      an upper superconducting material layer formed over the barrier layer,
      wherein at least the lower superconducting material layer comprises grains having respective sizes that are larger than a size of a Josephson junction defined by a contact area where the lower superconducting material layer overlaps with the upper superconducting material layer and the barrier layer.

2. The superconducting circuit of claim 1, wherein a grain of the grains overlaps with an entirety of the area.

3. The superconducting circuit of claim 1, wherein the lower superconducting material layer is epitaxial with the substrate.

4. The superconducting circuit of claim 1, wherein the lower superconducting material is formed of aluminum.

5. The superconducting circuit of claim 4, wherein the aluminum is oriented to have (110) planes that are parallel to the substrate.

6. The superconducting circuit of claim 1, wherein the grains in the lower superconducting material layer are formed by increasing the respective sizes of the grains through annealing.

7. The superconducting circuit of claim 1, wherein the substrate comprises at least one of silicon (Si) or sapphire.

8. A superconducting circuit comprising:
   a Josephson junction device comprising:
      a barrier layer formed on a superconducting alloy layer; and
      an upper superconducting material layer formed over the barrier layer,
      wherein the superconducting alloy layer comprises grains with an average grain size smaller than a width and a length of a size of a Josephson junction of the Josephson junction device and less than approximately 20 nm, and the size of the Josephson junction is defined by a contact area where the superconducting alloy layer overlaps with the upper superconducting material layer and the barrier layer.

9. The superconducting circuit of claim 8, wherein the superconducting alloy layer is an aluminum alloy layer.

10. The superconducting circuit of claim 9, wherein the average grain size of the aluminum alloy layer is less than 10 nm.

11. The superconducting circuit of claim 9, wherein the aluminum alloy layer comprises aluminum and at least one element selected from a group consisting of Si, Mg, V, Nb, Ta, La, Zr, Hf, Ti, Zn, In, and Sn.

12. The superconducting circuit of claim 9, wherein a concentration of aluminum in the aluminum alloy layer is in a range between about 66% and about 97%.

13. A method of forming a Josephson junction device comprising:
   forming a lower superconducting material layer on a substrate; and
   annealing the lower superconducting material layer at a temperature greater than about 200° C. to form grains of the lower superconducting material layer, wherein a single grain of the grains overlaps with an entirety of a width and a length of a Josephson junction of the Josephson junction device, the Josephson junction defined by a contact area where the lower superconducting material layer overlaps with an upper superconducting material layer and a barrier layer provided between the lower superconducting material layer and the upper superconducting material layer.

14. The method of claim 13, wherein the lower superconducting material layer is an aluminum layer.

15. The method of claim 13, wherein the single grain is epitaxially aligned with the substrate.

16. The method of claim 13, wherein the substrate comprises at least one of Si or sapphire.

17. The method of claim 13, wherein the annealing is performed within the temperature ranging from about 200° C. to about 570° C.

18. A method of forming a Josephson junction of a Josephson Junction device comprising:
   forming a superconducting alloy layer of the Josephson junction device on a substrate,
   wherein the superconducting alloy layer has grains having an average grain size smaller than a width and a length of the Josephson junction and less than approximately 20 nm, the Josephson junction defined by a contact area where the superconducting alloy layer overlaps with an upper superconducting material layer and a barrier layer provided between the superconducting alloy layer and the upper superconducting material layer.

19. The method of claim 18, wherein the superconducting alloy layer is an aluminum alloy layer.

20. The method of claim 18, wherein the average grain size is less than 10 nm.

21. The method of claim 19, wherein the aluminum alloy layer comprises aluminum and at least one element selected from a group consisting of Si, Mg, V, Nb, Ta, La, Zr, Hf, Ti, Zn, In, and Sn.

22. The method of claim 19, wherein a concentration of aluminum in the aluminum alloy layer is in a range between about 66% and about 97%.

23. The method of claim 19, wherein a quantity of the grains that overlap with the Josephson junction is greater than or equal to 10.

24. The method of claim 19, wherein a quantity of the grains that overlap with the Josephson junction is greater than or equal to 50.

25. The method of claim 19, wherein a quantity of the grains that overlap with the Josephson junction is greater than or equal to 100.

* * * * *